(12) United States Patent
Hutzler et al.

(10) Patent No.: US 10,868,170 B2
(45) Date of Patent: Dec. 15, 2020

(54) LAYOUT FOR NEEDLE CELL TRENCH MOSFET

(71) Applicant: Infineon Technologies Austria AG, Villach (AT)

(72) Inventors: Michael Hutzler, Villach (AT); Christof Altstaetter, Villach (AT)

(73) Assignee: Infineon Technologies Austria AG, Villach (AT)

( * ) Notice: Subject to any disclaimer, the term of this patent is extended or adjusted under 35 U.S.C. 154(b) by 23 days.

(21) Appl. No.: 16/203,089

(22) Filed: Nov. 28, 2018

(65) Prior Publication Data
US 2019/0165160 A1 May 30, 2019

(30) Foreign Application Priority Data
Nov. 29, 2017 (DE) .................. 10 2017 128 241

(51) Int. Cl.
*H01L 29/739* (2006.01)
*H01L 29/78* (2006.01)
(Continued)

(52) U.S. Cl.
CPC ...... *H01L 29/7811* (2013.01); *H01L 29/0638* (2013.01); *H01L 29/0696* (2013.01);
(Continued)

(58) Field of Classification Search
CPC ............. H01L 29/7811; H01L 29/0696; H01L 29/739; H01L 29/0638; H01L 29/404; H01L 29/407; H01L 29/45; H01L 29/66734; H01L 29/7813; H01L 29/41766; H01L 29/1095; H01L 29/7395; H01L 29/7397; H01L 29/7375; H01L 29/7393–7395; H01L 29/66325; H01L 29/66333–66348
See application file for complete search history.

(56) References Cited

U.S. PATENT DOCUMENTS 6,316,806 B1 11/2001 Mo
7,592,228 B2 9/2009 Williams et al.
(Continued)

FOREIGN PATENT DOCUMENTS

DE 102014119278 A1 6/2015
DE 102016103384 A1 8/2017

*Primary Examiner* — Cuong B Nguyen
(74) *Attorney, Agent, or Firm* — Murphy, Bilak & Homiller, PLLC

(57) ABSTRACT

A power semiconductor die conducts a load current between front and back side load terminals. The die includes an active region with a plurality of columnar trench cells. Each columnar trench cell includes: a section of a drift zone, a section of a channel zone and a section of a source zone, the channel zone section being electrically connected to the front side load terminal and isolating the source zone section from the drift zone section; and a control section with at least one control electrode in a control trench. An edge termination region between the die edge and the active region includes a front side zone configured to have an electrical potential different from an electrical potential of the front side load terminal. An isolating trench structure is arranged between the front side zone and the channel zone which is electrically connected to the front side load terminal.

18 Claims, 5 Drawing Sheets

(51) Int. Cl.
　　　*H01L 29/06*　　　(2006.01)
　　　*H01L 29/40*　　　(2006.01)
　　　*H01L 29/45*　　　(2006.01)
　　　*H01L 29/66*　　　(2006.01)

(52) U.S. Cl.
　　　CPC .......... *H01L 29/404* (2013.01); *H01L 29/407* (2013.01); *H01L 29/45* (2013.01); *H01L 29/66734* (2013.01); *H01L 29/739* (2013.01); *H01L 29/7813* (2013.01)

(56) References Cited

U.S. PATENT DOCUMENTS

| | | |
|---|---|---|
| 2010/0013552 A1 | 1/2010 | Darwish et al. |
| 2012/0326207 A1* | 12/2012 | Yoshimochi .......... H01L 21/763 257/139 |

* cited by examiner

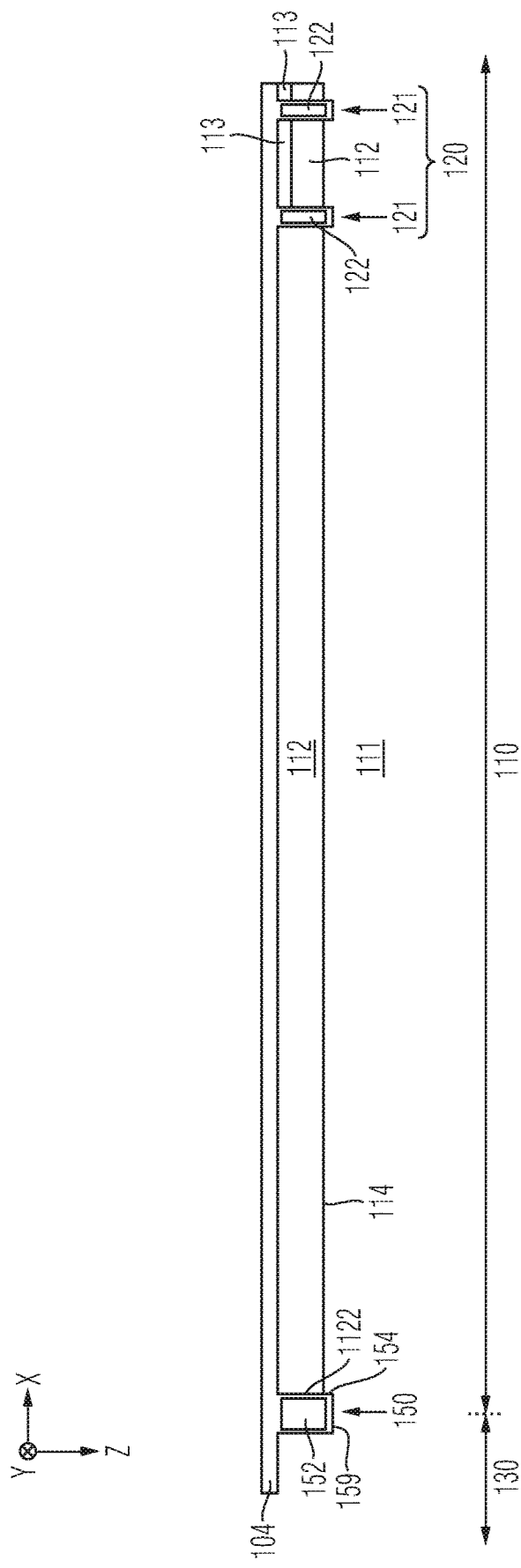

LAYOUT FOR NEEDLE CELL TRENCH MOSFET

TECHNICAL FIELD

This specification is directed to embodiments of a power semiconductor die with a plurality of columnar trench cells and to embodiments of a method of processing such a power semiconductor die. In particular, the present specification is directed to embodiments of a power semiconductor die where the columnar trench cells are isolated from a front side zone of an edge termination region, and to embodiments of a method of processing such a power semiconductor die.

BACKGROUND

Many functions of modern devices in automotive, consumer and industrial applications, such as converting electrical energy and driving an electric motor or an electric machine, rely on power semiconductor devices.

For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

A power semiconductor device usually comprises a power semiconductor die configured to conduct a load current along a load current path between two load terminals of the device. A front side load terminal, e.g., a source terminal, may be arranged at a front side of the die, and a back side load terminal, e.g., a drain terminal, may be arranged at a back side of the die. The die may be included within a package of the power semiconductor device, wherein such package may provide for electrical connections to the load terminals.

Further, the load current path may be controlled by means of a control electrode, sometimes referred to as gate electrode. For example, upon receiving a corresponding control signal from, e.g., a driver unit, the control electrode may set the power semiconductor die in one of a conducting state and a blocking state.

For conducting the load current, the power semiconductor die may have one or more power cells which may be arranged in a so-called active region of the power semiconductor device. For example, within the active region, the one or more power cells are electrically connected to the front side load terminal. The active region may be configured with a stripe pattern, according to which the power cells extend in a stripe like manner through the entire active region, or the active region may be configured with a cellular pattern, according to which the power cells exhibit a columnar design (also referred to as "needle design") and are distributed within the active region.

The power semiconductor die may be laterally confined by a die edge, and between die edge and the active region, there may be arranged an edge termination region. In terms of power semiconductor dies, such edge termination region is also referred to as a "high voltage termination structure", and it may serve the purpose of supporting the voltage handling capability of the power semiconductor die, e.g., by influencing the course of the electric field within the semiconductor die, e.g., so as to ensure reliable blocking capability of the power semiconductor die.

To this end, the edge termination region may comprise one or more components arranged within the semiconductor body, and also one or more components arranged above a surface of the semiconductor body. For example, the edge termination region may comprise a front side zone that—during operation of the power semiconductor die—exhibits an electrical potential of the back side load terminal.

In particular during a blocking state of the power semiconductor die, where there may be a high voltage difference between the front side load terminal and the back side load terminal, leakage currents shall be avoided.

SUMMARY

In accordance with some embodiments described herein, an isolating trench structure surrounds an active region including a plurality of columnar trench cells, wherein the isolating trench arrangement is configured for reducing a leakage current at a die front side, namely between a front side zone, e.g., exhibiting drain potential, and columnar trench cell sections, e.g., exhibiting source potential.

In accordance with an embodiment, a power semiconductor die is configured to conduct a load current between a front side load terminal and a back side load terminal of the power semiconductor die. The power semiconductor die comprises an active region with a plurality of columnar trench cells, wherein each columnar trench cell comprises: a section of a drift zone of a first conductivity type, a section of a channel zone of a second conductivity type and a section of a source zone of the first conductivity type, wherein the channel zone section is electrically connected to the front side load terminal and isolates the source zone section from the drift zone section; and a control section with at least one control electrode in a control trench, wherein the control section is configured to induce an inversion channel within the channel zone section for conduction of the load current. The power semiconductor die further comprises a die edge; an edge termination region between the die edge and the active region, the edge termination region including a front side zone configured to exhibit an electrical potential different from the electrical potential of the front side load terminal; and an isolating trench structure arranged between the front side zone and the channel zone electrically connected to the front side load terminal.

In accordance with a further embodiment, a method of processing a power semiconductor die is presented. The power semiconductor die is configured to conduct a load current between a front side load terminal and a back side load terminal of the power semiconductor die. The power semiconductor die comprises an active region with a plurality of columnar trench cells, wherein each columnar trench cell comprises: a section of a drift zone of a first conductivity type, a section of a channel zone of a second conductivity type and a section of a source zone of the first conductivity type, wherein the channel zone section is electrically connected to the front side load terminal and isolates the source zone section from the drift zone section; and a control section with at least one control electrode in a control trench, wherein the control section is configured to induce an inversion channel within the channel zone section for conduction of the load current. The power semiconductor die further comprises a die edge and an edge termination region between the die edge and the active region, the edge termination region including a front side zone configured to exhibit an electrical potential different from the electrical potential of the front side load terminal. The method comprises providing an isolating trench structure arranged between the front side zone and the channel zone electrically connected to the front side load terminal.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis being placed upon illustrating principles of the invention. Moreover, in the figures, like reference numerals designate corresponding parts. In the drawings:

FIG. 5 schematically and exemplarily illustrates a section of a vertical cross-section of a power semiconductor die in accordance with some embodiments.

DETAILED DESCRIPTION

Figure 1:
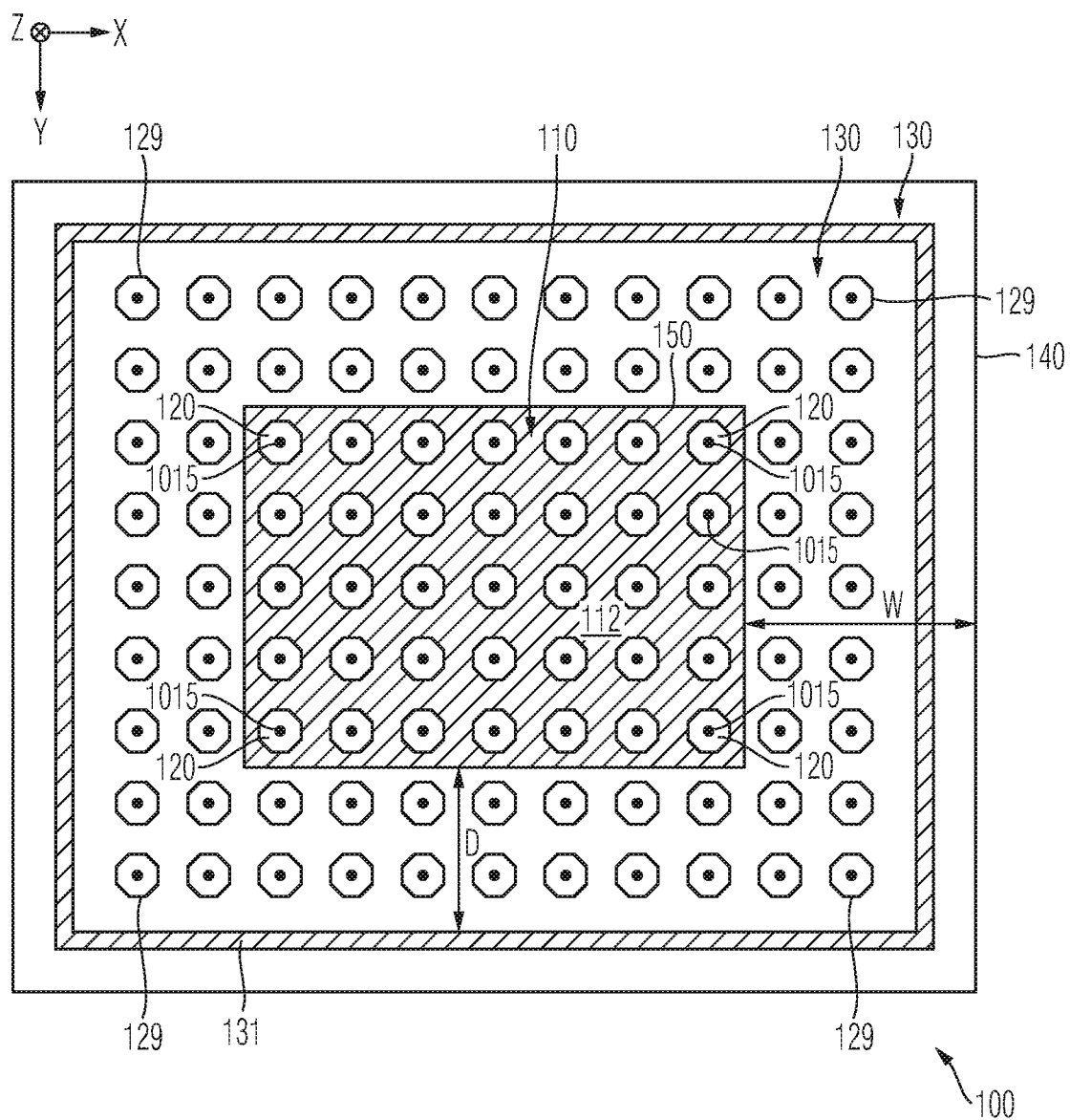
FIG. 1 schematically and exemplarily illustrates a section of a horizontal projection of a power semiconductor die in accordance with some embodiments.

In the following detailed description, reference is made to the accompanying drawings which form a part hereof and in which are shown by way of illustration specific embodiments in which the invention may be practiced.

In this regard, directional terminology, such as "top", "bottom", "front", "behind", "back", "leading", "trailing", "below", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor structure. This can be for instance the surface of a semiconductor wafer or a die or a chip. For example, both the (first) lateral direction X and the (second) lateral direction Y mentioned below can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer/chip/die. For example, the extension direction Z mentioned below may be an extension direction that is perpendicular to both the first lateral direction X and the second lateral direction Y.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of the device described herein. Further, in the context of the present specification, the term "in contact" intends to describe that there is a direct physical connection between two elements of the respective semiconductor device; e.g., a transition between two elements being in contact with each other may not include a further intermediate element or the like; i.e., said two elements may be in touch with each other.

In addition, in the context of the present specification, the term "electric insulation" is used, if not stated otherwise, in the context of its general valid understanding and thus intends to describe that two or more components are positioned separately from each other and that there is no ohmic connection connecting those components. However, components being electrically insulated from each other may nevertheless be coupled to each other, for example mechanically coupled and/or capacitively coupled and/or inductively coupled. To give an example, two electrodes of a capacitor may be electrically insulated from each other and, at the same time, mechanically and capacitively coupled to each other, e.g., by means of an insulation, e.g., a dielectric.

In this specification, n-doped is referred to as "first conductivity type", while p-doped is referred to as "second conductivity type". Alternatively, opposite doping relations can be employed so that the first conductivity type can be p-doped and the second conductivity type can be n-doped.

Specific embodiments described in this specification pertain to, without being limited thereto, a power semiconductor die, e.g., a power semiconductor die that may be used within a power converter or a power supply. For example, the power semiconductor die described herein is configured to be employed within power rectifier or within a power inverter, e.g., within a synchronous power rectifier or power inverter. For example, such rectifier/inverter is used as a part of a motor drive. Thus, in an embodiment, the power semiconductor die described herein can be configured to carry a part of a current that is to be fed to a load and/or, respectively, that is provided by a power source.

Accordingly, the term "power semiconductor die" as used in this specification intends to describe a single die with high voltage blocking and/or high current-carrying capabilities. In other words, such power semiconductor die is intended for high current, typically in the Ampere range, e.g., up to 5 or 300 Amperes, and/or voltages typically above 15 V, more typically up to 400 V, and above, e.g., up to at least 500 V or more than 500 V, e.g. at least 600 V. Further, the power semiconductor die described herein can be configured for high switching frequencies, e.g., for a switching frequency of at least 100 kHz and up to 2 MHz.

For example, the power semiconductor die described below may be a die that is configured to be employed as a power component in a low-, medium- and/or high voltage application. For example, the term "power semiconductor die" as used in this specification is not directed to logic semiconductor devices that are used for, e.g., storing data, computing data and/or other types of semiconductor based data processing.

For example, the die may comprise one or more active power cells, such as a monolithically integrated diode cell, and/or a monolithically integrated transistor cell, and/or a monolithically integrated IGBT cell, and/or a monolithically integrated RC-IGBT cell, and/or a monolithically integrated MOS Gated Diode (MGD) cell, and/or a monolithically integrated MOSFET cell and/or derivatives thereof. A plurality of such power cells may be integrated in the die.

In accordance with the embodiments described herein, the power semiconductor die includes power cells which are of a columnar trench cell type. For example, the power cells are not of the stripe trench type. The columnar trench cells can each comprise at least one needle trench. For example, in accordance with such columnar configuration, the total lateral extensions of each cell along each of the first lateral direction X and the second lateral direction Y amount to only a fraction of the total lateral extensions along the first lateral direction X and the second lateral direction Y of the power semiconductor die. For example, the total lateral extension of a respective columnar cell amounts to less than 1%, or to even less than 0.05% of the total extension of the power semiconductor die along one of the first lateral direction X and the second lateral direction Y. For example, a die with a side length of approx. 4 mm along the first lateral direction X and a typical cell pitch of approx. 2 μm leads to total lateral extension of a respective columnar cell of approx. 2/4000=0.05% of the total extension of the die along the first lateral direction X. Further, each columnar trench cell can exhibit, in parallel to the XY-plane, a rectangular, e.g., a quadratic horizontal cross-section, e.g., a rectangular horizontal cross-section with rounded corners, or an elliptical horizontal cross-section, or a circular horizontal cross-section, or a polygonal, e.g., an octagonal or a hexagonal horizontal cross-section. In an embodiment, each columnar trench cell has a maximum lateral extension and a maximum vertical extension, wherein the maximum lateral extension is smaller than ⅓, ¼ or ⅕ of the maximum vertical extension.

Figure 2:
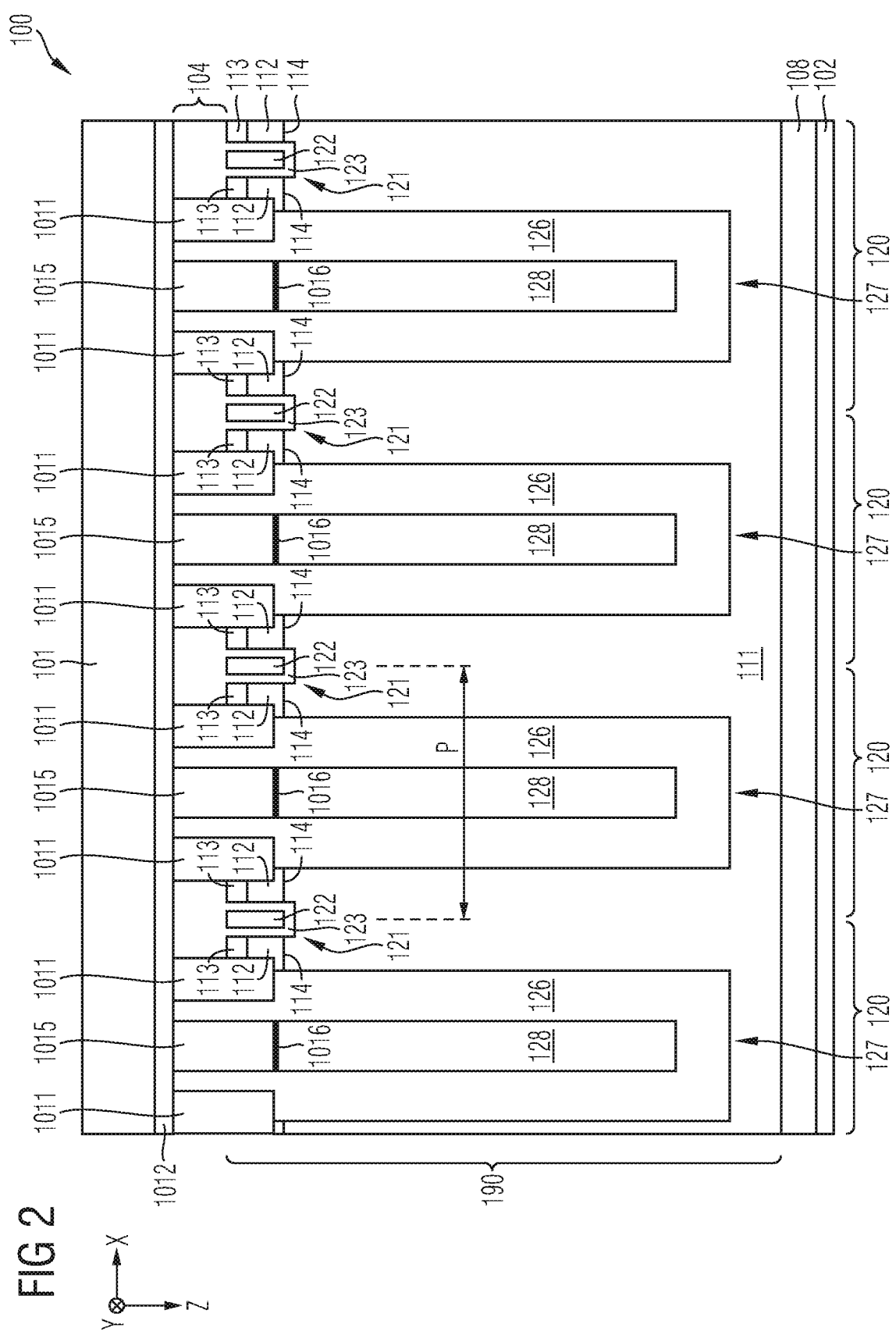
FIG. 2 schematically and exemplarily illustrates a section of a vertical cross-section of a power semiconductor die in accordance with one or more embodiments.

FIG. 1 schematically and exemplarily illustrates a section of a horizontal projection of a power semiconductor die 100 in accordance with one or more embodiments. FIG. 2 schematically and exemplarily illustrates a section of a vertical cross-section the power semiconductor die 100 in accordance with one or more embodiments, e.g., of the embodiment illustrated in FIG. 1. In FIG. 1, columnar trench cells 120 are only schematically indicated, wherein FIG. 2 shows some details regarding an exemplarily configuration of the columnar trench cells 120. In the following, it will be referred to both FIG. 1 and FIG. 2.

The power semiconductor die 100 can be, for example, a MOSFET, e.g., a MOSFET configured with a blocking voltage of at least 15 V and/or for a switching frequency of at least 50 kHz.

The power semiconductor die 100 is configured to conduct a load current between the front side load terminal 101 and a back side load terminal 102. The front side load terminal 101 can be a source terminal, and the back side load terminal 102 can be a drain terminal. For example, the power semiconductor die 100 is configured to conduct a load current of at least 10 A.

The front side load terminal 101 may be arranged at a front side of the power semiconductor die 100, and the back side load terminal 102 can be arranged at the back side of the power semiconductor die 100, the back side being arranged opposite of the front side. Hence, the power semiconductor die 100 may exhibit a vertical configuration, according to which the load current is conducted in parallel to the vertical direction Z.

The front side of the power semiconductor die 100 can be structured, e.g., at least with respect to an active region 110 and an edge termination region 130. For example, the front side load terminal 101 is only arranged within the active region 110. In contrast, in accordance with an embodiment, the back side of the power semiconductor die 100 is not structured; rather, for example, the back side load terminal 102 is formed by a back side metallization that is uniformly arranged at the die back side.

A semiconductor body 190 is coupled to both the front side load terminal 101 and the back side load terminal 102. In an embodiment, the semiconductor body 190 is arranged between the front side load terminal 101 and the back side load terminal 102, e.g., in a sandwich configuration.

As indicated, the power semiconductor die 100 comprises the active region 110. The edge termination region 130 is arranged between an outer edge 140 of the die and the active region 110. The die edge 140 may become into being by means of a wafer dicing processing step.

In accordance with an embodiment, the edge termination region 130 entirely surrounds the active region 110. A minimum width W of the edge termination region 130 may amount to at least a multiple of a pitch width P of the die 100, e.g., to at least 8 μm. For example, when surrounding the active region 110, the edge termination region 130 exhibits at least this minimum width W along its entire course.

As used herein, the terms "active region" and "edge termination region" are associated with their respective typical technical meanings. Hence, the load current of the power semiconductor die 100 is at least predominantly, e.g., exclusively, conducted by the active region 110, whereas the edge termination region 130 does not conduct the load current or, respectively, only an insignificant amount thereof. The edge termination region 130 may constitute or, respectively, comprise, a high voltage termination structure. The main purpose of the edge termination region 130 is to form a robust transition from the active region 110 to the die edge 140, e.g., a transition that is robust with respect to the voltage blocking capability of the power semiconductor die 100. It can be designed so as to appropriately influence the course of an electric field present within the semiconductor body 190, e.g., during a blocking state of the power semiconductor die 100.

In the following, exemplary aspects of the active region 110 will be briefly explained with respect to both FIG. 1 and FIG. 2. Thereafter, exemplary aspects of the termination region 130 will be explained, also with respect to the remaining drawings.

The active region 110 has a plurality of columnar trench cells 120. For example, each of the columnar trench cells 120 is configured to conduct a part of the load current, when the power semiconductor die 100 is in the conducting state. Hence, each columnar trench cell 120 can be an active columnar trench cell 120.

As explained above, each of the columnar trench cells 120 may comprise at least one needle trench. In accordance with an embodiment, each columnar trench cell 120 may comprise a field plate trench 127, wherein each field plate trench 127 includes a field plate trench electrode 128, wherein the field plate electrode can exhibit a needle design and may be electrically insulated from the semiconductor body 190 by a field plate trench insulator 126. The field plate trench 127 can be a needle trench, e.g., a needle trench with a polygonal horizontal cross-sectional area.

In FIG. 1, for illustrating purposes, each cell is only depicted by means of the outer contour of the respective field plate trench insulator 126 and by means of a respective field plate contact plug 1015 that may be employed for establishing an electrical connection between the front side load terminal 101 and the field plate trench electrode 128.

For example, each field plate trench 127 has a horizontal cross-sectional area significantly smaller than the horizontal cross-sectional area of the active region 110. In an embodiment, each field plate trench 127 has a polygonal horizontal cross-sectional area, e.g., an octagonal horizontal cross-sectional area, as indicated in FIG. 1. But, the embodiments described herein are not restricted to such exemplary trench design. For example, in another embodiment, each field plate trench 127 has a rectangular, e.g., a quadratic horizontal cross-section, e.g., a rectangular horizontal cross-section with rounded corners, or an elliptical horizontal cross-section, or a circular horizontal cross-section. However, in accordance with all embodiments described herein, the cells 120 do not exhibit a stripe configuration. For example, the field plate trench electrodes 128 are not provided within a stripe trench.

For example, the active region 110 includes at least one thousand columnar trench cells 120, at least ten thousand columnar trench cells 120, or even more than one million columnar trench cells 120. The cellular pattern of the power semiconductor die can be defined by the arrangement of the field plate trenches 127. For example, each columnar trench cell 120 comprises one field plate trench 127 designed as a needle trench. The needle field plate trenches 127 can be arranged in a matrix-like pattern defined by rows and columns; and this pattern may be present with in the entire active region 110 and also, at least partially, within the edge termination region.

As illustrated, the columnar trench cells 120 are not configured as stripe cells (which would have a total lateral extension substantially corresponding to a total lateral extension of the active region 110).

The semiconductor body 190 comprises a drift zone 111 of the first conductivity type. For example, the drift zone 111 is a weakly n-doped zone. At the back side, the drift zone 111 can be coupled to the back side load terminal 102, e.g., by means of a substrate 108, which may be of the first conductivity type and which may be doped at a higher concentration as compared to the drift zone 111.

Each columnar trench cell 120 may comprise a section of the drift zone 111, a section of a channel zone 112 of the second conductivity type and a section of a source zone 113 of the first conductivity type. The channel zone 112 can be p-doped, wherein the dopant concentration of the channel zone 112 may vary, e.g., along the vertical direction Z. The source zone 113 may be n-doped and may exhibit a dopant concentration greater than the dopant concentration of the drift zone 111 and, e.g., also greater than the dopant concentration of the substrate 108.

Within the active region 110, the channel zone 112 is electrically connected to the front side load terminal 101. To this end, a plurality of mesa contact plugs 1011 can be employed that extend from the front side load terminal 101 into the semiconductor body 190 so as to contact the channel zone sections 112 in each of the columnar trench cells 120. As illustrated, the mesa contact plugs 1011 may also establish an electrical connection between the source zone sections 113 and the front side load terminal 101, e.g., by contacting the source zone sections 113. The channel zone sections 112 isolate the source zone sections 113 from the drift zone sections 111. A transition between the channel zone 112 and the drift zone 111 forms a pn-junction 114. The pn-junction 114 may extend into each columnar trench cell 120.

In an embodiment, the channel zone 112 is formed by a uniform p-layer which is locally intersected by components of the columnar trench cells 120. Therefore, with respect to the columnar trench cells 120, it is stated that each columnar trench cell 120 comprises a section of the channel zone 112. Analogously, the source zone 113 may be formed by a uniform $n^+$-layer which is locally intersected by components of the columnar trench cells 120. Therefore, with respect to the columnar trench cells 120, it is stated that each columnar trench cell 120 comprises a section of the source zone 113. Analogously, the drift zone 111 may be formed by a uniform n-layer, and components of the columnar trench cells 120 may locally intersect this n-layer. Hence, with respect to the columnar trench cells 120, it is stated that each columnar trench cell 120 comprises a section of the drift zone 111. It shall be noted that the same reference numeral 112 is used to designate both the entire channel zone and one or more channel zone sections, and that the same reference numeral 113 is used to designate both the entire source zone and one or more source zone sections, and that the same reference numeral 111 is used to designate both the entire drift zone and one or more drift zone sections.

Each columnar trench cell 120 further includes a control section for controlling the respective columnar trench cell 120. Each control section may comprise at least one control electrode 122 which may be arranged, at least partially, in a control trench 121. The control electrodes 122 may be insulated control electrodes 122. For example, in order to provide an insulation between the semiconductor body 190 and the control electrodes 122, a control trench insulator 123 is arranged within each control trench 121. The control sections are configured to induce inversion channels within the channel zone sections 112 for conduction of the load current.

For example, each control electrode 122 is electrically connected to an output of a driver component (not illustrated). For example, the driver component provides a control voltage between its output and the front side load terminal 101, and, depending on the value of the control voltage, the control electrodes 122 set the power semiconductor die 100 in either the conducting state or the blocking state. During the conducting state, an inversion channel is induced within each channel zone section 112. During the blocking state, it is inhibited that such inversion channel comes into being. As illustrated, the control electrodes 122 overlap along the vertical direction Z with each of the source zone sections 113 and the channel zone sections 112. In an embodiment, each control electrode 122 extends further along the vertical direction Z as compared to the pn-junction 114.

In accordance with an embodiment, as already stated above, each columnar trench cell 120 may further comprise a field plate trench 127, wherein each field plate trench includes a field plate trench electrode 128 that is electrically insulated by a field plate trench insulator 126. The field plate trench 127 can be a needle trench, e.g., a needle trench with a polygonal horizontal cross-sectional area.

For example, in each columnar trench cell 120, the field plate trench insulator 126 is surrounded by the source zone section 113 and the channel zone section 112 of the respective columnar trench cell 120. For example, the field plate trench 127 forms the center of the respective columnar trench cell 120. Accordingly, also the mesa contact plugs 1011 may have a design so as to surround an upper portion of the field plate trench and to contact the source zone section 113 and the channel zone section 112, as illustrated in the vertical cross-section of FIG. 2 and also in the horizontal projection of FIG. 3.

For example, each field plate trench electrode 128 is electrically connected to the front side load terminal 101, wherein, to this end, said field plate contact plugs 1015 may be employed, as illustrated.

The total extension of each field plate trench 127 along the vertical direction Z can be significantly greater than the total extension of each control trench 123, e.g., by a factor of 5. Also, the total extension of each field plate trench electrode 128 along the vertical direction Z can be significantly greater than the total extension of each control electrode 122, e.g., by a factor of 5. For example, each control trench 123 extends into the semiconductor body 109 along the vertical direction Z for at least 1 µm, and each field plate trench 127 extends into the semiconductor body 109 along the vertical direction Z for at least 5 µm.

Further, for establishing the electrical connection between the respective field plate contact plug 1015 and the respective field plate trench electrode 128, an adhesion promoter 1016 may be used, wherein the adhesion promoter 1016 can be made of a material comprising at least one of titanium, titanium-nitride (e.g., a titanium/titanium-nitride stack), platinum, polysilicon, tungsten, and/or may exhibit a thickness within the range of 10 to 500 nm.

An electrically conductive coupling layer 1012 may be employed to provide for the electrical connection between the contact plugs 1011, 1015 and the front side load terminal 101, and between the semiconductor body 190 and the electrically conductive coupling layer 1012, there can be arranged an isolation layer 104, as illustrated in FIG. 2.

A pitch width P along the first lateral direction X of each columnar trench cell 120 may be within the range of 1 µm to 10 µm. For example, a width along the second lateral direction Y of each columnar trench cell 120 may also be within the range of 1 µm to 10 µm. As has already been indicated above, each columnar trench cell 120 can have a maximum lateral extension and a maximum vertical extension, wherein the maximum lateral extension is smaller than ⅓, ¼ or ⅕ of the maximum vertical extension.

Now referring in more detail to FIG. 1, the active region 110 may be surrounded by the edge termination region 130, as already described above. For example, the edge termination region 130 extends from the die edge 114 to the active region 110.

In an embodiment, the edge termination region 130 does not include any (active) columnar trench cell 120. However, the edge termination region 130 may include a plurality of non-active columnar trench cells 129. For example, such non-active columnar trench cells 129 are similarly configured as the (active) columnar trench cells 120, the difference being that, for example, the semiconductor regions of the non-active columnar trench cells 129 are not electrically connected to the front side load terminal 101 and/or that the non-active columnar trench cells 129 are not equipped with a control section, e.g., no control trench 122 is included in the non-active columnar trench cells 129 and/or that the non-active columnar trench cells 129 are not equipped with a source zone.

For example, the non-active columnar trench cells 129 can be configured in a manner as illustrated in FIG. 2, wherein no mesa contact plugs 1011 for contacting the semiconductor body 190 are provided and/or wherein no control trench 121 is provided and/or wherein no source zone section 113 is provided.

In accordance with an embodiment, each non-active columnar trench cell 129 may comprise a field plate trench 127, which may be configured in the same manner as described above. For example, for each non-active columnar trench cell 129, a field plate trench contact plug 1115 is provided so as to electrically connect the field plate trench electrodes 128 of non-active columnar trench cells 129 with the front side load terminal 101.

For example, the non-active columnar trench cells 129 are not configured to conduct the load current or a part thereof. Whereas in the edge termination region 130, typically no current at all is conducted, in an embodiment, non-active columnar trench cells 129 within the active region 110 may be configured to conduct a current which may come into being if the die 100 is operated in a way that a diode formed by the channel zone 112 and the drift zone 100 is biased in forward direction; in such operational mode a current may flow in non-active columnar trench cells 129 present within the active region 110.

The cell pattern present within the active region 110, e.g., the cell rows and/or the cell columns, may be continued at least partially within the edge termination region 130, wherein the cells present within the edge termination region 130 are not configured for load current conduction. For example, the continuation of the cell pattern external of the active region 110 may allow for carrying out the manufacturing process more uniformly. In addition, the non-active columnar trench cells 129 may also enhance the operation of the power semiconductor die 100. For example, the non-active columnar trench cells 129 may improve the reliability of the die 100, e.g., by contributing to an increase of a distance to a region from where unwanted contaminations (e.g. sodium ions (Na+)) could enter the active region 110 where they do harm.

Further, the active region 110 may also include a plurality of the non-active columnar trench cells 129. Thus, not every cell of the active region 110 must be an active columnar trench cell 120. This optional aspect will be described in more detail further below.

The edge termination region 130 comprises a front side zone 131. The front side zone 131 is configured to exhibit an electrical potential different from the electrical potential of the front side load terminal 101; e.g., the front side zone 131 exhibits the electrical potential of the back side load terminal 102, e.g., the potential of the drain terminal, e.g., at least during certain operating states of the power semiconductor die 100, e.g., during a blocking state of the power semiconductor die 100.

It shall be noted that the term "front side zone" 131 as used herein is not necessarily directed to a specifically designed component of the edge termination region 130. Rather, due to the structure of the entire die 100, situations may occur during which a zone proximate to a front side surface of the edge termination region 130 may temporarily exhibit the potential of the back side load terminal 102, wherein the spatial dimensions of this zone may vary. For example, in accordance with an embodiment, the front side zone 131 is not a surrounding drain trench or a specifically designed contact or the like.

For example, the front side zone 131, e.g., a zone proximate to the front side surface of the edge termination region 130 that may temporarily (e.g., during the blocking state) exhibit the potential of the back side load terminal 102, surrounds the active region 110. The front side zone 131 may further surround the non-active columnar trench cells 129 of the edge termination region. The front side zone 131 can be semiconductor zone, e.g., a semiconductor zone of the second conductivity type, wherein the semiconductor zone may extend from the insulation layer 104 along the vertical direction Z, e.g., at least as far or even further as compared to the channel zone 112. As indicated, this semiconductor zone present within the edge termination region 130 may exhibit the electrical potential of the back side load terminal 102, e.g., at least during a blocking state of the die 100.

In contrast to the exemplary and schematic illustration in FIG. 1, it shall be understood that the front side zone 131 must not necessarily surround the active region 110 and must not be a contiguous zone. For example, the edge termination region 130 may comprise a plurality of front side zones 131 that exhibit the electrical potential of the back side load terminal 102, e.g., at least during a blocking state of the die 100.

In accordance with an embodiment, the power semiconductor die 100 includes an isolating trench structure 150 that is arranged between the front side zone 131 and the channel zone 112 electrically connected to the front side load terminal 101. For example, in the region between the isolating trench structure 150 and the die edge 140, there is no electrical connection between the channel zone 112 and the front side load terminal 101; i.e., the entire region between the isolating trench structure 150 and the die edge 140 is devoid of any electrical connection between the channel zone 112 and the front side load terminal 11.

For example, the channel zone 112 is electrically connected to the front side load terminal 101 exclusively within the active region 110. The isolating trench structure 150 may surround the channel zone 112 electrically connected to the front side load terminal 101. For example, the isolating trench structure 150 is a closed contiguous structure, as illustrated in FIG. 1. As further indicated in FIG. 4, the isolating trench structure 150 can be an isolating trench with a trench insulator 153 that continuously and without interruption surrounds the channel zone 112 electrically connected to the front side load terminal 101.

In an embodiment, all active columnar trench cells 120 of the power semiconductor die 100 are included in a region that is entirely surrounded by the isolating trench structure 150, wherein this region may be the active region 110. For example, the isolating trench structure 150 may separate the active region 110 from the edge termination region 130.

As used herein, the term "isolating trench structure" shall mean that the trench structure 150 is configured for reducing or, respectively, avoiding a lateral leakage current between the front side zone 131 (which may exhibit the electrical potential of the back side load terminal 102) and a zone, e.g., the channel zone 112, electrically connected to the front side load terminal 101 within the active region 110. For example, the isolating trench structure 150 increases the total ohmic resistance of a path between these two zones 131, 112.

In an embodiment, the isolating trench structure 150 provides for a vertical oxide barrier that isolates the outermost channel zone sections 112 electrically connected to the front side load terminal 101 from the front side zone 131, wherein the front side zone 131 may exhibit a higher electrical potential than the front side load terminal 101, e.g. the electrical potential of the back side load terminal 102, e.g., the drain potential. This may allow for avoiding occurrence of leakage currents, e.g., at least in proximity to the front side surface of the edge termination region 130. Hence, in an embodiment, the isolating trench structure 150 may provide for an isolation with respect to currents flowing along a silicon front side surface and along a body volume down to a maximum depth, e.g., defined by the depth of the isolating trench structure 150.

Further, a minimum distance D along a lateral direction (e.g. first lateral direction X, second lateral direction Y or a linear combination of these lateral directions X and Y) between the isolating trench structure 150 and the front side zone 131 may amount to at least twice the pitch width P of each of the columnar trench cells 120.

Figure 3:
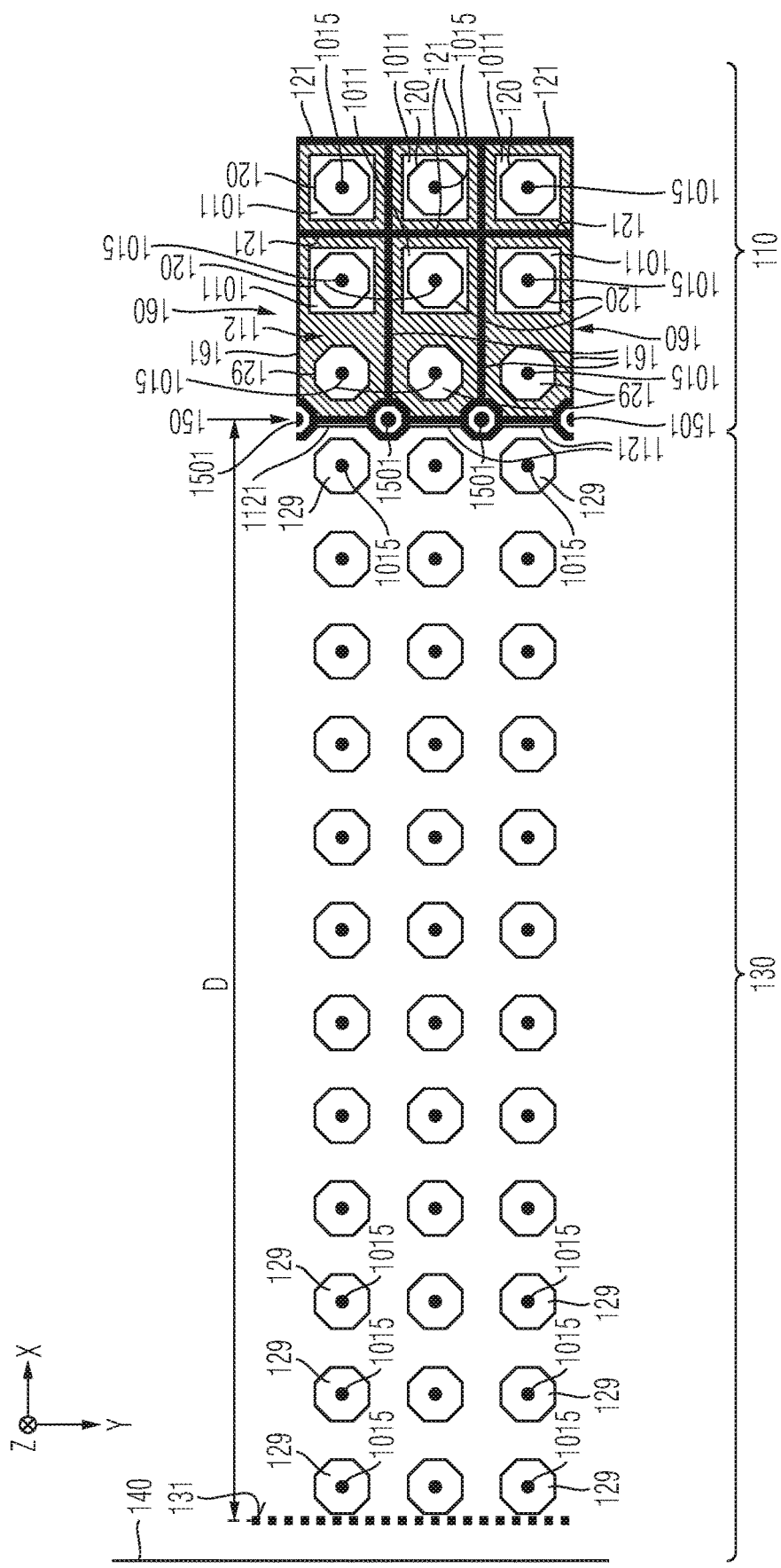
FIG. 3 schematically and exemplarily illustrates a section of a horizontal projection of a power semiconductor die in accordance with some embodiments.

Now additionally referring to FIG. 3, along the distance D between the front side zone 131 and the isolating trench structure 150, there can be arranged at least two, at least ten, or even more than ten of the non-active columnar trench cells 129. For example, the front side zone 131 does not extend into a subzone of the edge termination region 130 that includes most or even all of the non-active columnar trench cells 129 of the edge termination region 130, as illustrated in FIG. 1.

The isolating trench structure 150 may intersect with an edge portion of the channel zone 112. For example, as illustrated in FIG. 3, a small remaining portion 1121 of the channel zone 112 may be arranged within the termination region 130, wherein this small remaining portion 1021 of the channel zone 112 is not electrically connected to the front side load terminal 101; rather, the remaining portion 1021 can be electrically floating. In contrast, the main portion of the channel zone 112 arranged within the active region 110 is electrically connected to the front side load terminal 101, e.g., by means of the mesa contact plugs 1011 mentioned above.

Figure 4:
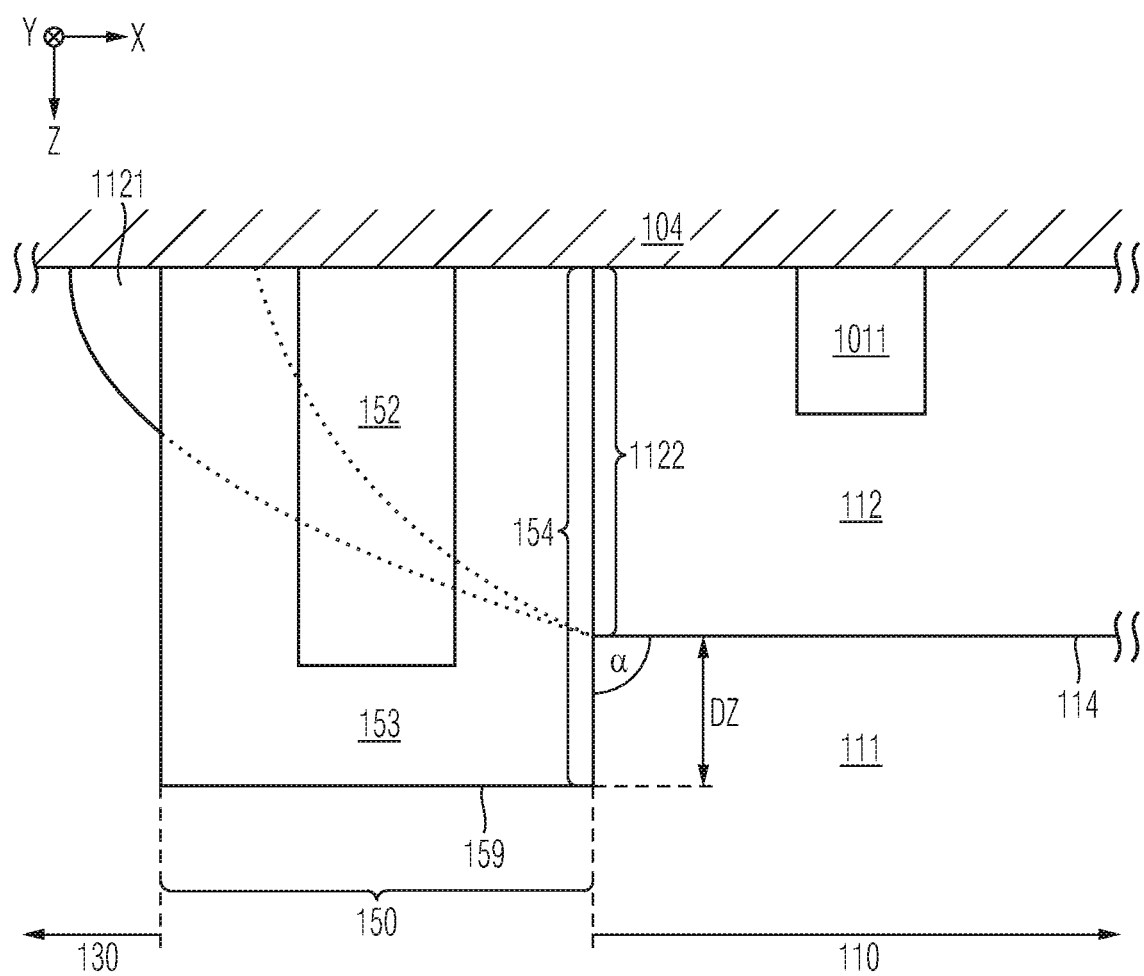
FIG. 4 schematically and exemplarily illustrates a section of a vertical cross-section of a power semiconductor die in accordance with one or more embodiments.

As exemplarily illustrated in FIG. 4, the isolating trench structure 150 may extend deeper into the semiconductor body 190 than the pn-junction 114. For example, a minimum distance DZ along the vertical direction Z between the pn-junction 114 and a bottom 159 of the isolating trench structure 150 amounts to at least 40 nm.

The isolating trench structure 150 may include said trench insulator 153, wherein the trench insulator 153 may be arranged in contact with the channel zone 112. As indicated in FIG. 4, in case of non-presence of the isolating trench structure 150, the channel zone 112 can typically exhibit an edge portion having a bended course (indicated by the two dotted lines) that extends from the pn-junction 114 until it reaches the isolation layer 104. In accordance with an embodiment, the isolating trench structure 150 interrupts the edge portion of the channel zone 112 or, respectively, cuts of the edge portion of the channel zone 112. And eventually remaining portion 1121 of the channel zone 112 that faces to the termination region 130 or, respectively, forms a part thereof, is not electrically connected to the front side load terminal 101 but is electrically floating, in accordance with an embodiment. As schematically illustrated by means of the upper dotted line in FIG. 4, it shall be understood that in accordance with another embodiment, such remaining portion 1121 of the channel zone is not present within the termination region 130.

In accordance with an embodiment, an intersection angle α between the pn-junction 114 and the trench insulator 153 of the isolating trench structure 150 is within the range of 80° to 100°; e.g., the intersection angle α amounts to 90°. For example, within the active region 110 the pn-junction 114 extends substantially horizontally, e.g. along the first lateral direction X and along the second lateral direction Y. A sidewall 154 of the isolating trench structure 150 may extend substantially vertically. For example, at the point where the pn-junction 114 intersects with the trench insulator 153, the pn-junction 114 extends at least substantially horizontally, e.g., in parallel to a plane defined by the two lateral directions X and Y.

Further, within the active region 110 the pn-junction 114 extends substantially horizontally at a first level, wherein the trench insulator 153 intersects with the pn-junction 114 at a level within the range of 90% to 150% of the first level. However, for fulling its isolating function, it may be appropriate that the isolating trench structure 150 extends deeper than the first level; e.g., the intersection level can be within the range of 100% to 150% of the first level. For example, the first level is the intermediate vertical level of the pn-junction 114 within the active region 110.

For example, the isolating trench structure 150 can hence be employed so as to destroy the bended course of the edge portion of the channel zone 112. Thereby, the emergence of too high peaks of an electric field that occasionally go in line with such bended course can be avoided.

In an embodiment, the channel zone 112 terminates by means of a vertically extending channel zone termination sidewall 1122. For example, the channel zone termination sidewall 1122 extends perpendicular to the pn-junction 114, e.g., exclusively in parallel to the vertical direction Z, e.g., with a maximum angle variation of +/−5° to the vertical direction Z, or even within the range of +/−1° to the vertical direction Z. For example, the vertically extending channel zone termination sidewall 1122 entirely surrounds the channel zone 112 that is electrically connected to the front side load terminal 101 within the active region 110. As indicated above, the sidewall 154 of the isolating trench structure 150 may interface with the channel zone termination sidewall 1122. For example, the channel zone termination sidewall 1122 contacts the sidewall 154 and vertically overlaps therewith along its total vertical extension, wherein the sidewall 154 of the isolating trench structure 150 may extend further along the vertical direction Z as the channel zone termination sidewall 1122, e.g., at least by 10 nm further (cf. distance DZ in FIG. 4).

A lateral width of the isolating trench structure 150, e.g., along the first lateral direction X can be within the range of 100 nm to 1 μm.

The above described concept of the isolating trench structure 150 is also schematically and exemplarily illustrated in FIG. 5. As illustrated, the channel zone 112 can be terminated by the isolating trench structure 150. The pn-junction 114 extends horizontally until it interfaces, in a right angle, with the trench insulator 153.

In an embodiment, the isolating trench structure 150 essentially consists of a trench that is entirely filled with an insulating material. In another embodiment, the isolating trench structure 150 comprises a trench electrode 152. For example, also this trench electrode 152 can entirely surround the channel zone 112 electrically connected to the front side load terminal 101.

The trench electrode 152 can be electrically connected to the front side load terminal 101 or to another terminal of the die 100 or, respectively, the trench electrode 152 is electrically floating.

In another embodiment, the trench electrode 152 is electrically connected to one or more or all of the control electrodes 122 of the columnar trench cells 120.

For example, in order to connect the trench electrode 152 of the isolating trench structure 150 with one or more or all of the control electrodes 122 of the columnar trench cells 120, the power semiconductor die 100 may further comprise a connector structure 160 that electrically connects the trench electrode 152 with one or more or all of the control electrodes 122.

As has been explained above, the active region 110 may comprise not only the active columnar trench cells 120, but also the non-active columnar trench cells 129. In an embodiment, at least each outermost cell of the active region 110 is a non-active columnar trench cell 129. For example, each of these non-active columnar trench cells 129 intersect with the channel zone 112 electrically connected to the front side load terminal 101.

In accordance with an embodiment, the active region 110 comprises a subregion adjacent to the isolating trench structure 150 and arranged concentric with respect to the isolating trench structure 150, wherein the subregion comprises a plurality of the non-active columnar trench cells 129. For example, each path extending perpendicular from the isolating trench structure 150 towards a center region of the active region 110 passes (or, respectively, traverses) at least one, at least two or even more than two of the non-active columnar trench cells 129 of the subregion before passing one of the (active) columnar trench cells 120.

In accordance with an embodiment, the subregion does not include a control trench 121, which may allow for providing the die 100 with reduced $Q_{GD}$ charge. Additionally or alternatively, the subregion does not include any source zone section 113.

The optional concept of the subregion elucidated above is schematically and exemplarily illustrated in FIGS. 3 and 5. For example, as illustrated in FIG. 5, the subregion does neither include a control trench section 122 nor a source zone section 113. As further expressed in FIG. 5, each path extending perpendicular from the isolating trench structure 150 towards the center region of the active region 110 passes (or, respectively, traverses) at least ten of the non-active columnar trench cells 129 of the subregion before passing one of the (active) columnar trench cells 120.

For example, a distance between the isolating trench structure 150 and each of the outermost ones of the active columnar cells 120 amounts to at least two pitch widths P, e.g., at least ten pitch widths P.

As indicated above, the isolating trench structure 150 may include the trench electrode 152, wherein the trench electrode 152 may be electrically connected to one or more or all of the control electrodes 122. The trench electrode 152 may also be electrically connected to the driver output mentioned above, wherein, to this end, trench electrode plugs 1501 may be employed (cf. FIG. 3).

For example, for establishing the electrical connection to one or more or all of the control electrodes 122, the trench connector structure 160 comprises at least one stripe trench 161 that extends away from the trench structure 150 through the subregion into the active region 110, wherein the at least one stripe trench 161 passes at least one of the non-active columnar trench cells 129 until it reaches one of the plurality of columnar trench cells 120. As explained above, in an embodiment, along a distance between each outermost one of the plurality of columnar trench cells 120 and the isolating trench structure 150, the power semiconductor die 100 comprises at least one of non-active columnar trench cells 129, and this at least one of non-active columnar trench cells 129 may be passed by the stripe trench 161.

As exemplarily illustrated in FIG. 3, the connector structure 160 may comprise a plurality of such stripe trenches 161. For example, the isolating trench structure 150 also exhibits a stripe configuration and extends along the second lateral direction Y, wherein the stripe trenches 161 of the connector structure 160 extend perpendicular thereto, namely along the first lateral direction X. For example, the one or more stripe trenches 161 extent laterally throughout the entire active region 110 until they interface with another section of the isolating trench structure 150, e.g., referring to FIG. 1, the one or more stripe trenches 161 can interconnect the two opposing portions of the isolating trench structure 150 that extend along the second lateral direction Y. For example, there can be one stripe trench 161 for each cell row of the active region 110. In another embodiment, there are provided less stripe trenches 161, e.g., one stripe trench 161 for each group of two or three or four adjacent cell rows.

For example, for each row of active columnar trench cells 120, there is at least one control trench 121 that extends along the second lateral direction Y, e.g., throughout the entire active region 110. Along their lateral extensions, the control trenches 121 intersect with the stripe trenches 161, e.g., they join into the one or more stripe trenches 161. The one or more stripe trenches 161 may each comprise a stripe trench electrode (not illustrated), and the control electrodes 122 that are included in the control trenches 121 may be arranged in contact with the stripe trench electrode at the locations where the control trenches 121 intersect with the one or more stripe trenches 161.

As explained above, in accordance with an embodiment, in the subregion, there are no control trenches. Hence, the ladder-like configuration formed by stripe trenches 161 and the control trenches 121 is not present within the subregion. For example, within the subregion, each field plate trench 127 (cf. FIG. 2) of the non-active columnar trench cells 129 is only passed by one or two of the stripe trenches 161, wherein in the remaining portion of the active region 110, each field plate trench 127 (cf. FIG. 2) of the columnar trench cell 129 is passed by one or two of the stripe trenches 161 and by one or two of the control trenches 121.

Hence, in accordance with one or more embodiments described above, by providing the isolating trench structure 150 that surrounds the outermost channel zone sections 112 electrically connected to the front side load terminal 101, a leakage current, at least in proximity to the front side termination region 130, is reduced or even entirely suppressed. As illustrated above, the isolating trench structure 150 may comprise the trench electrode 152 that may be electrically connected to the control electrodes 122 of the columnar trench cells 120. Proposed herein is also a specific manner of connecting the control electrodes 122 with the trench electrode 152 of the isolating trench structure 150. For example, by connecting the surrounding trench electrode 152 at different locations along the die 100 by plugs 1501, the impact of single closed contacts is mitigated by contact redundancy and control electrode current distribution along the surrounding trench electrode 152, in accordance with one or more embodiments. For example, within the active region 110 no contact plugs (that would extend through the insulation layer 104) are provided for contacting the control electrodes 122. For example, in the subregion of the active region 110 where there are no active columnar trench cells 120 (but, e.g., only non-active columnar trench cells 129), control trenches 121 a not provided, which may yield a reduced $Q_{GD}$ charge.

Presented herein is also a method of processing a power semiconductor die. The power semiconductor die is configured to conduct a load current between a front side load terminal and a back side load terminal of the power semiconductor die. The power semiconductor die comprises an active region with a plurality of columnar trench cells, wherein each columnar trench cell comprises: a section of a drift zone of a first conductivity type, a section of a channel zone of a second conductivity type and a section of source zone of the first conductivity type, wherein the channel zone section is electrically connected to the front side load terminal and isolates the source zone section from the drift zone section; and a control section with at least one control electrode in a control trench, wherein the control section is configured to induce an inversion channel within the channel zone section for conduction of the load current. The power semiconductor die further comprises a die edge and an edge termination region between the die edge and the active region, the edge termination region including a front side zone configured to exhibit an electrical potential different from the electrical potential of the front side load terminal. The method comprises providing an isolating trench structure arranged between the front side zone and the channel zone electrically connected to the front side load terminal.

Features of exemplary embodiments of the method of processing the power semiconductor die can correspond to the features of the exemplary embodiments of the power semiconductor die 100 explained above. Thus, regarding exemplary embodiments of the method, it may be referred to the aforesaid.

In the above, embodiments pertaining to power semiconductor dies and corresponding processing methods were explained. For example, these semiconductor dies are based on silicon (Si). Accordingly, a monocrystalline semiconductor region or layer or section, e.g., components 190, 108, 111, 112, 113 can be a monocrystalline Si-region or Si-layer. In other embodiments, polycrystalline or amorphous silicon may be employed.

It should, however, be understood that the semiconductor die can be made of any semiconductor material suitable for manufacturing a semiconductor die. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The aforementioned semiconductor materials are also referred to as "homojunction semiconductor materials". When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)- aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide ($Si_xC_{1-x}$) and silicon-SiGe heterojunction semiconductor materials. For power semiconductor devices applications currently mainly Si, SiC, GaAs and GaN materials are used.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A power semiconductor die configured to conduct a load current between a front side load terminal and a back side load terminal of the power semiconductor die, the power semiconductor die comprising:
    an active region with a plurality of columnar trench cells, each columnar trench cell comprising:
        a section of a drift zone of a first conductivity type, a section of a channel zone of a second conductivity type and a section of a source zone of the first conductivity type, the channel zone section being electrically connected to the front side load terminal and isolating the source zone section from the drift zone section; and
        a control section with at least one control electrode in a control trench, the control section being configured to induce an inversion channel within the channel zone section for conduction of the load current;
    a die edge;
    an edge termination region between the die edge and the active region, the edge termination region including a front side zone configured to have an electrical potential different from an electrical potential of the front side load terminal; and
    an isolating trench structure arranged between the front side zone and the channel zone which is electrically connected to the front side load terminal,
    wherein the isolating trench structure comprises a trench electrode,
    wherein the power semiconductor die further comprises a trench connector structure electrically connecting the trench electrode with the at least one control electrode or, respectively, with each of the at least one control electrode of the columnar trench cells, and
    wherein the trench connector structure comprises at least one stripe trench extending away from the isolating trench structure into the active region.

2. The power semiconductor die of claim 1, wherein the isolating trench structure surrounds the channel zone which is electrically connected to the front side load terminal.

3. The power semiconductor die of claim 1, wherein the entire region between the isolating trench structure and the die edge is devoid of any electrical connection between the channel zone and the front side load terminal.

4. The power semiconductor die of claim 1, wherein the isolating trench structure comprises a trench insulator arranged in contact with the channel zone which is electrically connected to the front side load terminal.

5. The power semiconductor die of claim 1, wherein a transition between the channel zone and the drift zone forms a pn-junction, and wherein the isolating trench structure extends further along a vertical direction than the pn-junction.

6. The power semiconductor die of claim 5, wherein an intersection angle between the pn-junction and the trench insulator is within a range of 80° to 100°.

7. The power semiconductor die of claim 5, wherein within the active region, the pn-junction extends substantially horizontally at a first level, and wherein the trench insulator intersects with the pn-junction at a level within a range of 90% to 150% of the first level.

8. The power semiconductor die of claim 1, wherein a vertically extending channel zone termination sidewall terminates the channel zone.

9. The power semiconductor die of claim 1, wherein a distance between the front side zone and the isolating trench structure is at least twice a pitch width of the columnar trench cells, and wherein the pitch width is measured along a lateral direction of each columnar trench cell.

10. The power semiconductor die of claim 1, wherein the front side zone is a semiconductor zone, and/or wherein the front side zone has an electrical potential of the back side load terminal.

11. The power semiconductor die of claim 1, wherein the at least one stripe trench passes at least one non-active columnar trench cell until it reaches one of the plurality of columnar trench cells.

12. The power semiconductor die of claim 11, wherein the at least one stripe trench extends along a first lateral direction and connects two sections of the isolating trench structure with each other.

13. The power semiconductor die of claim 12, wherein the control trenches of the columnar trench cells extend along a second lateral direction and join into the at least one stripe trench.

14. The power semiconductor die of claim 11, wherein the control electrodes of the control sections are arranged in contact with a stripe trench electrode of the at least one stripe trench.

15. The power semiconductor die of claim 1, wherein along a distance between each outermost one of the plurality of columnar trench cells and the isolating trench structure, the power semiconductor die comprises at least two non-active columnar trench cells.

16. A power semiconductor die, comprising:
    a front side load terminal;
    a back side load terminal;
    an active region with a plurality of trench cells formed in a semiconductor body, each trench cell comprising:
        a section of a drift zone of a first conductivity type, a section of a channel zone of a second conductivity type and a section of a source zone of the first conductivity type, the channel zone section being electrically connected to the front side load terminal and isolating the source zone section from the drift zone section;
        a control section with at least one control electrode in a control trench; and
        a needle-shaped field plate trench;
    a plurality of mesa contact plugs extending from the front side load terminal into the semiconductor body to contact the channel zone sections of the plurality of trench cells;
    an edge termination region between an edge of the power semiconductor die and the active region; and
    an isolating trench structure laterally surrounding some or all outermost ones of the mesa contact plugs so that the outermost ones of the mesa contact plugs surrounded by the isolating trench structure are electrically isolated from the edge termination region.

17. A method of processing a power semiconductor die, the power semiconductor die being configured to conduct a load current between a front side load terminal and a back side load terminal of the power semiconductor die, the method comprising:
  forming an active region with a plurality of columnar trench cells, each columnar trench cell comprising: a section of a drift zone of a first conductivity type, a section of a channel zone of a second conductivity type and a source zone of the first conductivity type, the channel zone section being electrically connected to the front side load terminal and isolating the source zone from the drift zone section; and a control section with at least one control electrode in a control trench, the control section being configured to induce an inversion channel within the channel zone section for conduction of the load current, the power semiconductor die having a die edge and an edge termination region between the die edge and the active region, the edge termination region including a front side zone configured to have an electrical potential different from an electrical potential of the front side load terminal;
  providing an isolating trench structure arranged between the front side zone and the channel zone which is electrically connected to the front side load terminal, wherein the isolating trench structure comprises a trench electrode,
  wherein the method further comprises forming a trench connector structure electrically connecting the trench electrode with the at least one control electrode or, respectively, with each of the at least one control electrode of the columnar trench cells, and
  wherein the trench connector structure comprises at least one stripe trench extending away from the isolating trench structure into the active region.

18. A power semiconductor die configured to conduct a load current between a front side load terminal and a back side load terminal of the power semiconductor die, the power semiconductor die comprising:
  an active region with a plurality of columnar trench cells, each columnar trench cell comprising:
    a section of a drift zone of a first conductivity type, a section of a channel zone of a second conductivity type and a section of a source zone of the first conductivity type, the channel zone section being electrically connected to the front side load terminal and isolating the source zone section from the drift zone section; and
    a control section with at least one control electrode in a control trench, the control section being configured to induce an inversion channel within the channel zone section for conduction of the load current;
  a die edge;
  an edge termination region between the die edge and the active region, the edge termination region including a front side zone configured to have an electrical potential different from an electrical potential of the front side load terminal; and
  an isolating trench structure arranged between the front side zone and the channel zone which is electrically connected to the front side load terminal, wherein along a distance between each outermost one of the plurality of columnar trench cells and the isolating trench structure, the power semiconductor die comprises at least two non-active columnar trench cells.

* * * * *